United States Patent
O'Connell et al.

(10) Patent No.: US 9,805,779 B2
(45) Date of Patent: Oct. 31, 2017

(54) WRITING TO MULTI-PORT MEMORIES

(71) Applicant: TAIWAN SEMICONDUCTOR MANUFACTURING COMPANY, LTD., Hsinchu (TW)

(72) Inventors: Cormac Michael O'Connell, Kanata (CA); Atul Katoch, Kanata (CA)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 80 days.

(21) Appl. No.: 14/547,840

(22) Filed: Nov. 19, 2014

(65) Prior Publication Data

US 2015/0138903 A1 May 21, 2015

Related U.S. Application Data

(60) Provisional application No. 61/906,661, filed on Nov. 20, 2013.

(51) Int. Cl.
*G11C 8/16* (2006.01)
*G11C 7/02* (2006.01)
*G11C 11/419* (2006.01)

(52) U.S. Cl.
CPC ............. *G11C 8/16* (2013.01); *G11C 7/02* (2013.01); *G11C 11/419* (2013.01)

(58) Field of Classification Search
CPC ..................................... G11C 8/16; G11C 7/02

USPC .................................................. 365/189.16
See application file for complete search history.

(56) References Cited

U.S. PATENT DOCUMENTS

| | | | | |
|---|---|---|---|---|
| 5,629,943 A * | 5/1997 | McClure | ............... | G11C 29/02 365/201 |
| 5,751,644 A * | 5/1998 | Ansel | ............... | G11C 7/1087 365/189.05 |
| 5,818,757 A * | 10/1998 | So | ............... | G11C 11/5621 365/185.18 |
| 7,477,566 B2 * | 1/2009 | Morikawa | ............... | G11C 8/16 365/154 |
| 2002/0006072 A1 * | 1/2002 | Kunikiyo | ............... | G11C 8/16 365/230.05 |
| 2012/0051151 A1 * | 3/2012 | Wu | ............... | G11C 11/412 365/189.04 |
| 2014/0198562 A1 * | 7/2014 | Hwang | ............... | G11C 11/412 365/154 |

* cited by examiner

*Primary Examiner* — Hoai V Ho
*Assistant Examiner* — Muna A Techane
(74) *Attorney, Agent, or Firm* — Hauptman Ham, LLP

(57) ABSTRACT

A circuit includes a first memory cell and a data control circuit configured to provide first data and second data. The first memory cell has a first port and a second port. The first data is written from the first port to the first memory cell. The second data is based on information of the first data. The second port is configured to write the second data to the first memory cell based on a detection of a write disturb caused by the second port to the first port.

20 Claims, 5 Drawing Sheets

300

WRITING TO MULTI-PORT MEMORIES

BACKGROUND

Multi-port memories provide independent data channels enabling a read or a write on each channel to addresses asynchronously from each other. For illustration, one port of a memory cell, such as a port P_A, is write accessed while another port of the same cell, such as a port P_B, is dummy read accessed. A dummy read refers to a situation in which signals for the memory cell are in a read condition but the data on a port for reading is not reliable and is thus not used. Generally, the dummy read from port P_B increases a load on a storage node of the memory cell to be written by port P_A, and thus prolongs the write time from port P_A. Stated differently, the write from port P_A is write disturbed by port P_B. In many situations, effects of the load from the dummy read from port P_B are worse when the dummy read from port P_B starts before the write from port P_A, compared with the situation where the write from port P_A starts before the dummy read from port P_B, for example.

One solution to improve the write disturb to port P_A is to increase the clock cycle and thus increase write timing margins for port P_A. Alternatively and/or additionally, the write drivers for port P_A are strengthened. However, such a solution results in slow cycle times, larger areas for the strong write drivers, and increased power consumption. Another solution is to restrict dual port accesses to preclude port P_A and port P_B addressing the same row, which is restrictive and is not useful in many applications.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
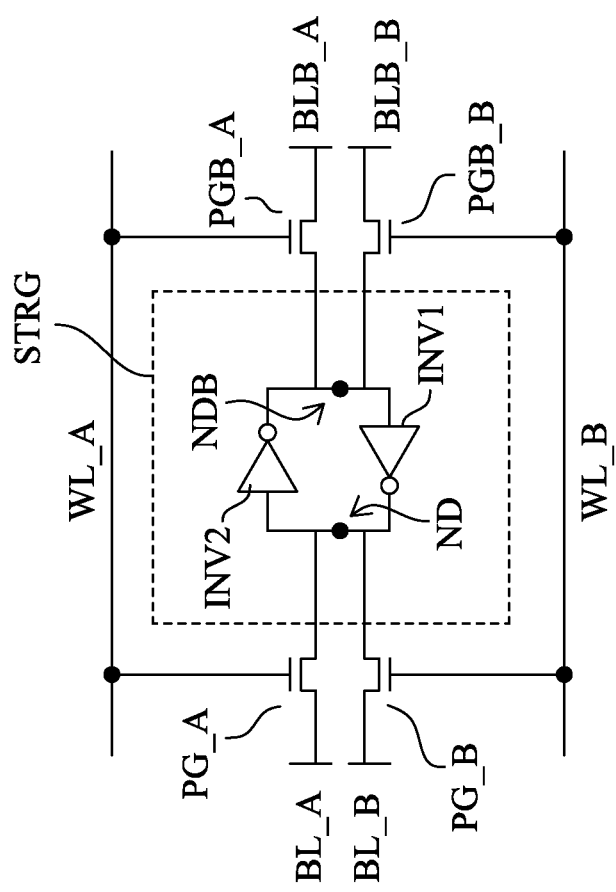
FIG. 1 is a diagram of a memory cell, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. In some embodiments, a multi-port memory cell includes a port P_A and a port P_B, for example. Further, port P_A is write accessed to write data to the memory cell. When the write from port P_A is disturbed by a dummy read from port P_B, port P_B is configured to assist port P_A to write the same data of port P_A to the memory cell. Effectively, the memory cell is under a dual write of the same data from both port P_A and port P_B, and the write disturb to port P_A is avoided. Writing from port P_B to assist port P_A is for a time period when the disturb condition lasts, including, for example, when a word line WL_A of port P_A and a word line WL_B of port P_B overlap, e.g., are activated during a same time period.

Compared with other approaches, write cycles in various embodiments of the present disclosure are faster. Further, overcoming the write disturb does not require a large area or high power consumption, and does not restrict multi-port functionalities. Compared with approaches that use a write assist circuitry, the write assist circuitry is no longer used, resulting in less die area in embodiments of the present disclosure. Power consumption in various embodiments of the present disclosure is reduced because the dual write is only used when the write disturb is detected. No additional stress is imposed on the memory cell, the write cycle time is improved, and the compiler to compile the memory macro is eased since the write disturb no longer impacts the memory design. In situations where more than one port is write disturbed, each of such a port is assisted with another write of the same data by another port of the same memory cell to prevent the write disturb.

Memory Cell

FIG. 1 is a diagram of a memory cell 100, in accordance with some embodiments. Memory cell 100 includes a storage area STRG, pass gates PG_A and PGB_A electrically coupled with word line WL_A and bit lines BL_A and BLB_A, and pass gates PG_B and PGB_B electrically coupled with word line WL_B and bit lines BL_B and BLB_B.

Storage area STRG includes two storage nodes ND and NDB to store data for memory cell 100. Node ND is at an output of an inverter INV1 and node NDB is at an output of an inverter INV2. Inverters INV1 and INV2 are cross-coupled. By operation of memory cell 100, a logical value of node ND or node NDB is an inverse of one another.

Word line WL_A and a pair of pass gates PG_A and PGB_A form a first read-write port, and, for illustration, is called a port P_A (not labeled). A word line WL_B and a pair of pass gates PG_B and PGB_B form a second read-write port, and, for illustration, is called a port P_B (not labeled). In some embodiments, port P_A and port P_B are asynchronous. For example, one of port P_A or port P_B can be in operation any time, and during operation of that port, the other port can start its corresponding operation. When memory cell 100 is write accessed using the first port P_A, for example, data to be written to memory cell 100 is applied to bit lines BL_A and BLB_A at a drain of corresponding pass gates PG_A and PGB_A. Word line WL_A is then activated with a high logical value to turn on pass gates PG_A and PGB_A. As a result, the data on bit line BL_A is transferred through pass gate PG_A to node ND, and the data on bit line BLB_A is transferred through pass gate PGB_A to node NDB.

For another example, when memory cell 100 is read accessed using the first port P_A, bit lines BL_A and BLB_A are pre-charged to a high logical value. Word line WL_A is then activated with a high logical value to turn on pass gates PG_A and PGB_A. As a result, the data on node ND is transferred to bit line BL_A, and the data on node NDB is transferred to bit line BLB_A. The data on bit lines BL_A and BLB_A is then processed to reveal the data on corresponding nodes ND and NDB. Operations of port P_B, including read and write operations, are similar to those of port P_A.

Figure 3:
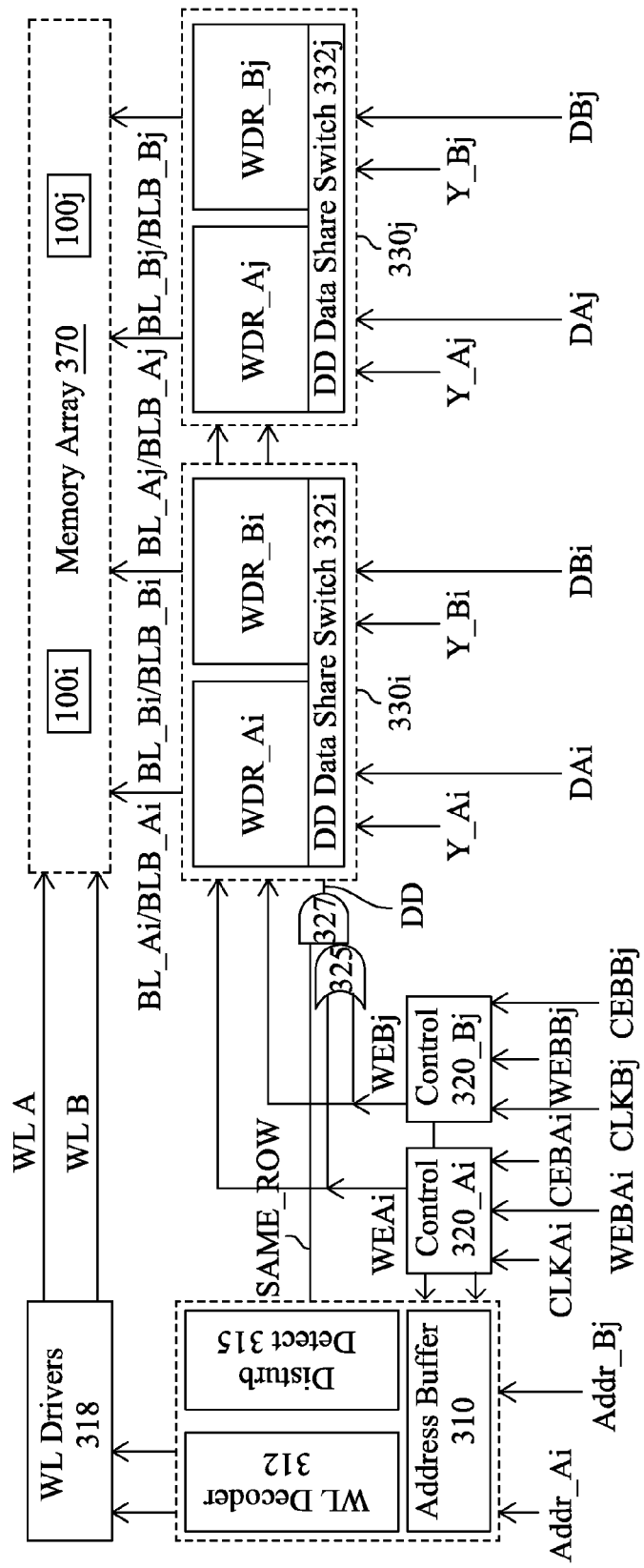
FIG. 3 is a diagram of a circuit having circuitry to prevent a write disturb to memory cells of FIG. 2, in accordance with some embodiments.

In some embodiments, word lines WL_A and WL_B are each coupled to memory cells 100 in a row of a memory array, such as a memory array 370 in FIG. 3. Further, bit lines BL_A and BLB_A are each coupled to memory cells 100 in a column of memory array 370. Similarly, bit lines BL_B and BLB_B are each coupled to the memory cells 100 in the same column of bit lines BL_A and BLB_A. Word lines WL_A and WL_B are each also called a control line because word lines WL_A and WL_B control operations of corresponding pass gates PG_A, PGB_A, PG_B, and PGB_B. Bit lines BL_A, BLB_A, BL_B, and BLB_B are each also called a data line because bit lines BL_A, BLB_A, BL_B, and BLB_B carry data for memory cell 100.

Memory cell 100 shown having two ports is for illustration. A memory cell having more than two ports is within the contemplated scope of the present disclosure.

Memory Row, Disturb Illustration

Figure 2:
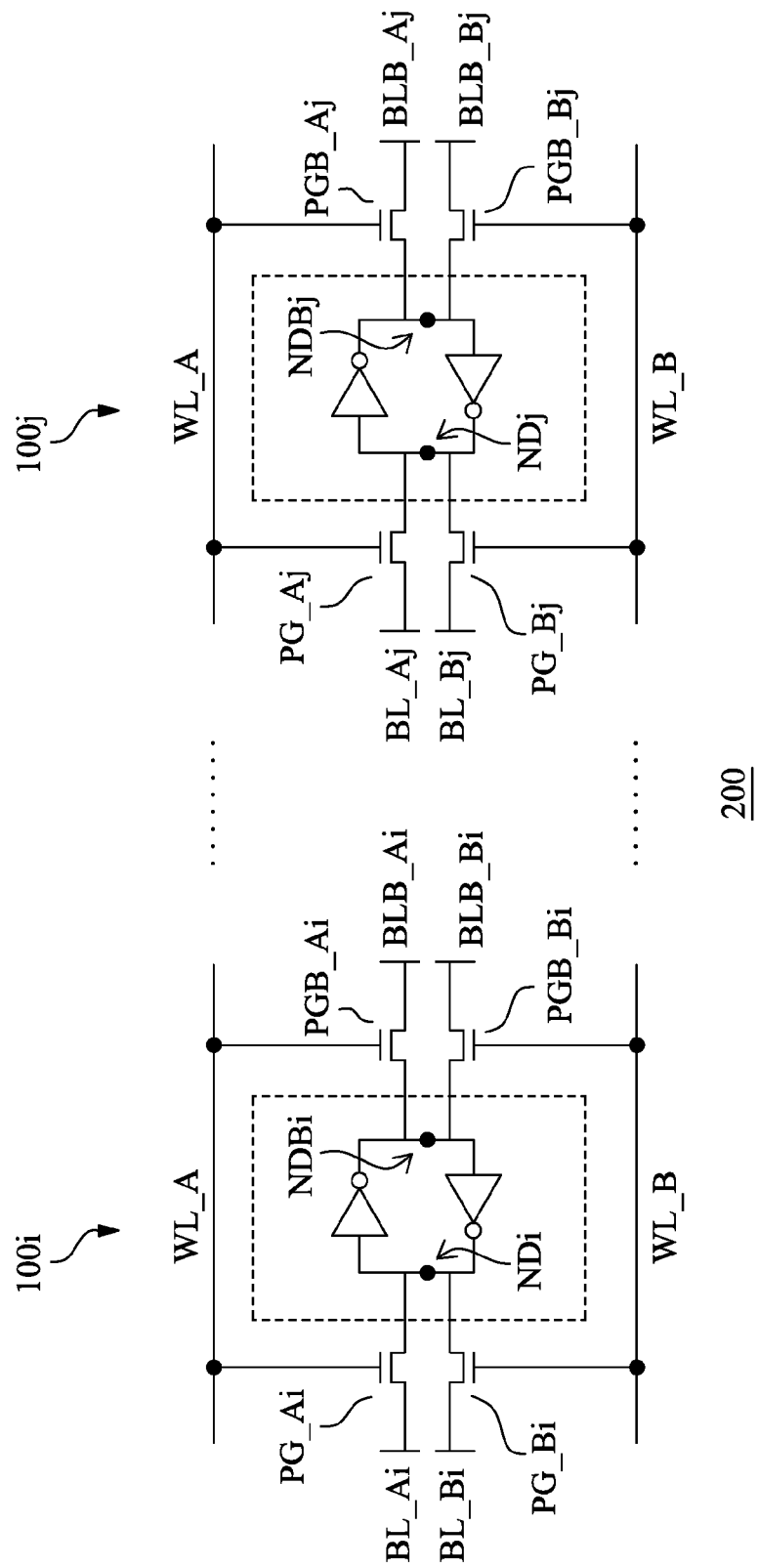
FIG. 2 is a diagram of a row of memory cells in FIG. 1, in accordance with some embodiments.

FIG. 2 is a diagram of a row 200 of a plurality of cells 100 in FIG. 1, in accordance with some embodiments. For illustration, two memory cells 100$i$ and 100$j$ are shown. Ports P_A and P_B of cell 100$i$ are called ports P_Ai and P_Bi, respectively, and ports P_A and P_B of cell 100$j$ are called ports P_Aj and P_Bj, respectively. Memory cells 100$i$ and 100$j$ are both controlled according to word lines WL_A and WL_B.

In some embodiments, a write disturb occurs to a memory cell when a port is write accessed to the memory cell while the other port of the same memory cell is in a dummy read condition. For illustration, a write disturb occurs to memory cell 100$i$. For example, both word lines WL_A and WL_B are activated with a high logical value. Word line WL_A is activated for port P_Ai to write to memory cell 100$i$. Word line WL_B is activated for port P_Bj to write to or to read from memory cell 100$j$. Because word line WL_B is activated, pass gates PG_Bi and PGB_Bi of memory cell 100$i$ are turned on. As a result, Port P_Bi of memory cell 100$i$ is in a condition for reading or in a dummy read condition, and port P_Ai is disturbed by the dummy read of port P_Bi.

In some embodiments, when a write disturb condition occurs to a port of memory cell 100 due to the dummy read of another port of the same memory cell 100, a write operation of the same data of the port being write disturbed is performed in place of the dummy read. In the example that port P_Ai of memory cell 100$i$ is disturbed by a dummy read from port P_Bi of memory cell 100$i$, in some embodiments, a write operation is performed from port P_Bi to prevent the dummy read from port P_Bi. The data on bit lines BL_Bi and BLB_Bi to be written form port P_Bi has the same logical value as the data on corresponding bit lines BL_Ai and BLB_Ai to be written from port P_Ai, which will be explained in detail with reference to FIG. 3. Effectively, memory cell 100$i$ has a dual write of the same data from both port P_Ai and port P_Bi. In some embodiments, the write operation from port P_Bi is performed during a time period when the write disturb condition lasts, including, for example, when word line WL_A and word line WL_B are activated at the same time. Because the write operation from port P_Bi prevents the additional bit line loading that would otherwise be caused by port P_Bi, port P_Ai is no longer disturbed, and various embodiments of the present disclosure are called write disturb free.

Various embodiments of the disclosure are advantageous over other approaches. For illustration, node NDi and node NDBi store a high and a low logical value, respectively. Further, node NDi and NDBi are to be written with a corresponding low and high logical value from port P_Ai. As a result, bit lines BL_Ai and BLB_Ai are applied with a corresponding low and high logical value to be transferred to corresponding nodes NDi and NDBi. When a dummy read occurs to port P_Bi and causes a write disturb to port P_Ai, bit lines BL_Bi and BLB_Bi are applied with a low and a high logical value from corresponding bit lines BL_Ai and BLB_Ai, to be written to corresponding nodes NDi and NDBi. Because bit line BL_Bi is applied with a low logical value and pass gate PG_Bi is turned on, the low logical value on bit line BL_Bi pulls node NDi to a low logical value, in addition to bit line BL_Ai pulling node NDi to the low logical value. Further, because bit line BLB_Bi is applied with a high logical value and pass gate PGB_Bi is turned on, the high logical value on bit line BLB_Bi pulls node NDBi to a high logical value, in addition to bit line BLB_Ai pulling node NDBi to the high logical value.

In contrast, in approaches that do not apply a write from port P_Bi and leave port P_Bi to have a dummy read, the pre-charge high logical value of bit line BL_Bi causes an additional load to node NDi. As a result, the additional load from bit line BL_Bi in other approaches slows down node NDi to transition from a high to a low logical value. In other words, port P_Bi in those approaches slows the write operation of port P_Ai. Compared with those approaches, the write operation from port P_Ai in various embodiment of the present disclosure is faster because the write from port P_Bi assists port P_Ai in writing the same data to memory cell 100$i$ in addition to the write operation from port P_Ai. Effectively, the load on bit line BL_Bi is eliminated.

In the above illustration, port P_Ai being write accessed and port P_Bi being dummy read accessed are for illustration. The dual write to memory cell 100$i$ explained above is also applicable when port P_Bi is write accessed and port P_Ai is dummy read accessed. Such a situation occurs, for example, when word line WL_B is activated for port P_Bi to write to memory cell 100$i$ and word line WL_A is activated for port P_Aj to read from or to write to memory cell 100$j$. In such a situation, the dummy read from port P_Ai is prevented by having a write from port P_Ai of the same data from port P_Bi, in addition to the write from port P_Bi. The write from port P_Ai receives the data from the write from port P_Bi in a manner similar to the situation where port P_Ai is write accessed and port P_Bi is dummy read accessed as explained above.

In some embodiments, when port P_Ai of memory cell 100$i$ is write accessed and port P_Bi of memory cell 100$i$ is dummy read accessed as illustrated above, port P_Bj of memory cell 100$j$ is write accessed, and port P_Aj of memory cell 100$j$ is dummy read accessed. In such embodiments, port P_Aj is configured to receive the data from port P_Bj to be written to memory cell 100$j$, also resulting in a dual write of the same data for memory cell 100$j$, in addition to a dual write of the same data for memory cell 100$i$. Similarly, when port P_Bi of cell memory 100$i$ is write accessed, port P_Ai is dummy read accessed, port P_Aj is write accessed, and port P_Bj is dummy read accessed. In various embodiments, port P_Bj is configured to receive the data from port P_Aj to be written to memory cell 100$j$, also resulting in a dual write of the same data for memory cell 100j, in addition to a dual write of the same data for memory cell 100i.

Disturb Free Circuitry

FIG. 3 is a diagram of a circuit 300, in accordance with some embodiments. For illustration, circuit 300 includes circuitry to prevent write disturb to memory cells 100i and 100j. Preventing write disturb to other memory cells is similar. For illustration, memory cells 100i and 100j of row 200 in FIG. 2 are shown in memory array 370 of FIG. 3. Memory cells 100i and 100j receive word lines WL_A and WL_B as illustratively shown in detail in FIG. 2. Memory cell 100i receives bit lines BL_Ai, BLB_Ai, BL_Bi, and BLB_Bi as illustratively shown in detail in FIG. 2. Similarly, memory cell 100j receives bit lines BL_Aj, BLB_Aj, BL_Bj, and BLB_Bj as illustratively shown in detail in FIG. 2.

For further illustration, memory cells 100i and 100j have ports P_Ai, P_Aj, P_Bi, and P_Bj, are on the same row, and have the same row address. Additionally, port P_Ai of memory cell 100i is write accessed, port P_Bj of memory cell 100j is read accessed, and the time port P_Ai is write accessed and port P_Bj is read access overlap. Because port P_Bj is read accessed, word line WL_B is also activated and causes a dummy read on port P_Bi. Port P_Ai is therefore disturbed.

Address buffer 310 receives and latches addresses Addr_Ai and Addr_Bj for use by word line decoder 312 and disturb detect 315. Information provided by address buffer 310 indicates operational status of port P_Ai and port P_Bj, including, for example, whether each port P_Ai or port P_Bi is enabled or disabled for writing.

Word line decoder 312, based on address information provided by address buffer 310, provides information for word line drivers 318 to generate signals for word lines WL_A and WL_B for both memory cells 100i and 100j.

Disturb detect circuit 315 generates a signal SAME_ROW based on addresses Addrs_Ai and Addrs_Bj. For example, in some embodiments, when the row address of port P_Ai and port P_Bj match, port P_Ai and P_Bj access the same row. As a result, signal SAME_ROW is activated with a high logical value.

Signal WEBAi and signal WEAi have a logical inverse of one another. In some embodiments, when signal WEBAi and signal WEAi are logically low and high respectively, port P_Ai is enabled for writing. Similarly, signal WEBBj and signal WEBj have a logical inverse of one another. In some embodiments, when signal WEBBj and signal WEBj are logically high and low, respectively, port P_Bj is enabled for reading.

Control circuit Control 320_Ai based on clock signal CLKAi, write enable signal WEBAi, and chip enable signal CEBAi generates write enable signal WEAi. For example, at the rising edge of clock signal CLKAi, if signal WEBAi is logically low, signal WEAi is generated with a high logical value. Similarly, control circuit 320_Bj, based on clock signal CLKBj, write enable signal WEBBj, and chip enable signal CEBBj, generates write enable signal WEBj. In the example that port P_Bj is read accessed, at the rising edge of clock signal CLKBj, signal WEBBj is logically high, signal WEBj is generated with a low logical value. However, if port P_Bj is also write accessed, signal WEBBj would be logically low, and signal WEBj is generated with a high logical value.

Based on operations of OR gate 325 and AND gate 327, signal DD is activated with a high logical value when signal SAME_ROW is logically high and at least one of signal WEAi and WEBj is logically high. Effectively, signal DD, when activated, indicates at least one of port P_Ai or port P_Bj is subject to a write disturb. In this example, because port P_Ai of memory cell 100i is enabled for writing, signal DD is logically high and port P_Ai is subject to a write disturbed by port P_Bi of the same memory cell 100i. In some embodiments, signal DD remains active for as long as the write disturb condition lasts.

Data controller 330i receives data DAi for port P_Ai and data DBi for port P_Bi of memory cell 100i. For example, data driver WDR_Ai, based on data DAi, generates data to be applied to bit lines BL_Ai and BLB_Ai to be written from port P_Ai of memory cell 100i. Similarly, data driver WDR_Bi, based on data DBi, generates data to be applied to bit lines BL_Bi and BLB_Bi to be written from port P_Bi. Data controller 330i also receives column address signal Y_Ai for port P_Ai and column address signal Y_Bi for port P_Bi of memory cell 100i.

Double data (DD) share switch or data circuit 332i operates with write data driver WDR_Bi so that driver WDR_Bi provides data DAi to bit lines BL_Bi and BLB_Bi for the write from port P_Bi to assist port P_Ai when port P_Ai is write disturbed by port P_Bi. In the example that port P_Ai is disturbed by port P_Bi, when signal DD is logically high, DD share switch 332i causes driver WDR_Bi to provide data DAi to bit lines BL_Bi and BLB_Bi for the write from port P_Bi to be written to cell 100i, in addition to port P_Ai writing data DAi to memory cell 100i. In the situation where port P_Bi is write disturbed by port P_Ai, DD share switch 332i also provides information so that driver WDR_Ai provides data DBi to bit lines BL_Ai and BLB_Ai for the write from port P_Ai to assist port P_Bi.

Functioning similar to data controller 330i, data controller 330j receives data DAj for port P_Aj and data DBj for port P_Bj. For example, data driver WDR_Aj, based on data DAj, generates data to be applied to bit lines BL_Aj and BLB_Aj to be written from port P_Aj. Similarly, data driver WDR_Bj, based on data DBj, generates data to be applied to bit lines BL_Bj and BLB_Bj to be written from port P_Bj. Data controller 330j also receives column address signal Y_Aj for port P_Aj and column address signal Y_Bj for port P_Bj of memory cell 100j.

Functioning similar to DD share switch 332i, DD share switch 332j operates with driver WDR_Bj so that driver WDR_Bj provides data DAj to bit lines BL_Bj and BLB_Bj for the write from port P_Bj to assist port P_Aj when port P_Aj is write disturbed by port P_Bj. When port P_Bj is write disturbed by port P_Aj, DD switch 332j also provides information so that data driver WDR_Aj provides data DBj to bit lines BL_Aj and BLB_Aj for the write from port P_Aj to assist port P_Bj.

Dual Write Circuit

Figure 4:
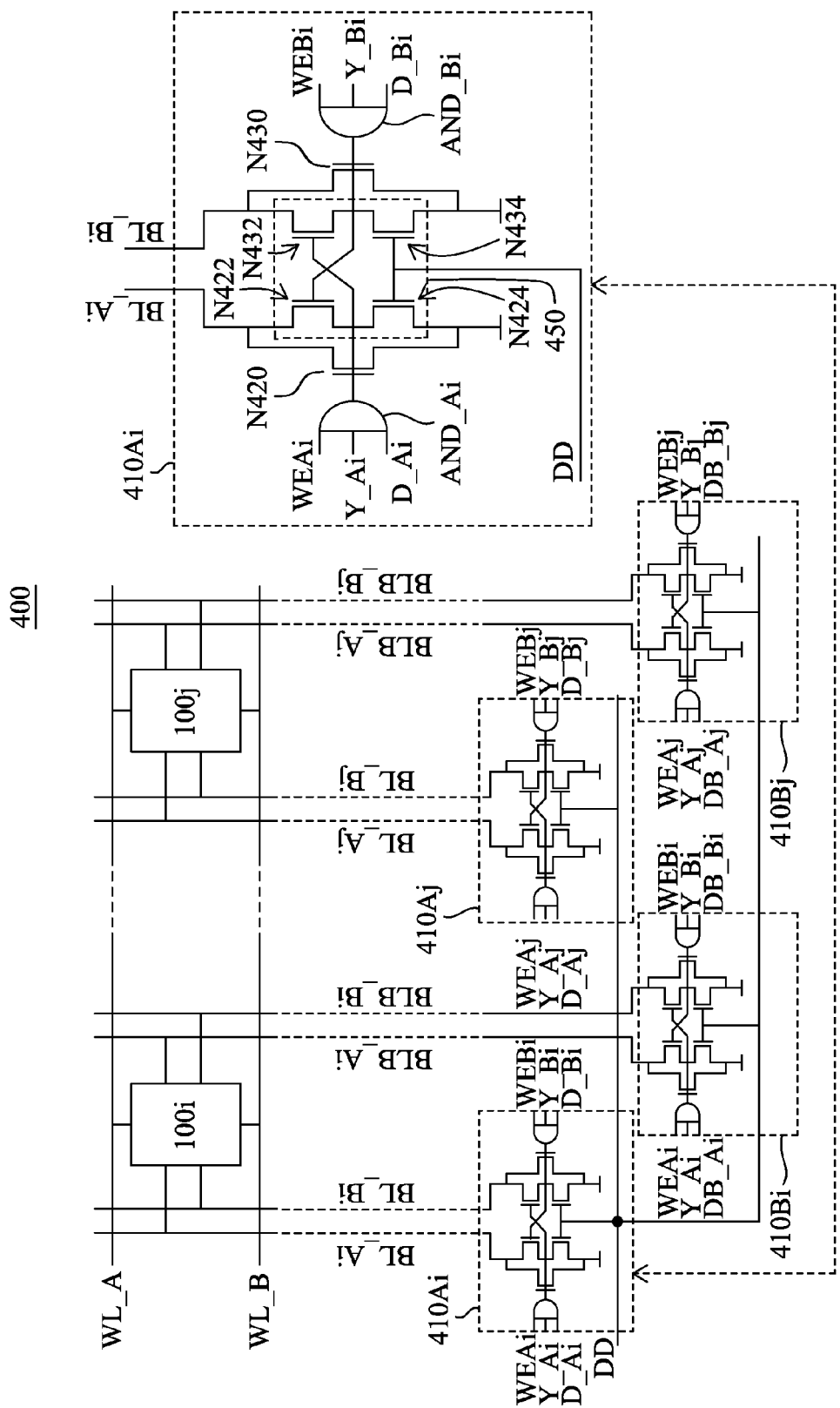
FIG. 4 is a diagram of a circuit having details of some circuit elements in the circuit of FIG. 3, in accordance with some embodiments.

FIG. 4 is a diagram of a circuit 400, in accordance with some embodiments. Circuit 400 is used to illustrate a dual write of the same data to a memory cell when a first port of that memory cell is disturbed by a second port of the same memory cell. Other circuits performing the same function are within the contemplated scope of the present disclosure. Circuit 400 includes circuit 330i in FIG. 3 implemented as circuits 410Ai and 410Bi in FIG. 4. Circuit 400 also includes circuit 330j in FIG. 3 implemented as circuits 410Aj and 410Bj in FIG. 4. Circuits 410Ai, 410Bi, 410Aj, and 410Bj each have the same circuit elements but receive different signals. For simplicity, only circuit elements of circuit 410Ai are labeled.

For illustration, port P_Ai is writing low and high logical values to corresponding nodes NDi and NDBi of memory cell 100*i*. As a result, data D_Ai is logically high, and data D_Bi is logically low. Further, bit lines BL_Ai and BLB_Ai are applied with corresponding low and high logical values. In some embodiments, bit lines BL_Ai, BLB_Ai are pre-charged to a high logical value before a write operation. Bit line BL_Ai is then pulled to a low logical value while bit line BLB_Ai stays at the pre-charged high logical value. The high and low logical values on bit lines BL_Ai and BLB_Ai are then transferred to corresponding nodes NDi and NDBi of memory cell 100*i* as explained with reference to FIG. 1.

With reference to circuit 410Ai, when the row addresses of ports P_Ai and P_Bj are not the same, port P_Ai is not write disturbed. As a result, signal DD is logically low. Further, transistors N424 and N434 are turned off, causing circuit 450 to be turned off and electrically disconnected from bit lines BL_Ai and BLB_Ai.

AND gate AN_Ai and transistor N420 in circuit 410Ai operate to cause bit line BL_Ai to have a low logical value. For example, signals WEA, Y_Ai, and D_Ai are all logically high to provide a high logical value to a gate of transistor N420. Transistor N420 is therefore turned on and pulls bit line BL_Ai to supply voltage VSS (not labeled) or ground at the source of transistor N420. Further, AND gate AND_Bi and transistor N420 in circuit 410Bi operate to cause bit line BLB_Ai to have a high logical value. For example, data DB_Ai being logically low turns off transistor N420 in circuit 410Bi, and electrically disconnects bit line BLB_Ai from the low logical value or supply voltage VSS. Bit line BLB_Ai therefore remains at the pre-charged high logical value.

For further illustration, port P_Ai of memory cell 100*i* is disturbed by port P_Bi of memory cell 100*i*. In some embodiments, corresponding low and high logical values of bit lines BL_Ai and BLB_Ai are also provided to bit lines BL_Bi and BLB_Bi to be written to corresponding nodes NDi and NDBi of memory cell 100*i*. Similarly to the situation of bit lines BL_Ai and BLB_Ai, in a write disturb situation to port P_Ai, bit line BL_Bi is also pulled to a low logical value, and bit line BLB_Bi stays at the pre-charged high logical value.

For example, in a disturbed situation, signal DD is logically high. Circuits 410Ai and 410Bi then function to also provide a low and a high logical value to corresponding bit lines BL_Bi and BLB_Bi. For example, because signal DD is logically high, transistors N424 and N434 in circuits 410Ai and 410Bi are turned on. The high logical value at the gate of transistor N420 in circuit 410Ai is also at the gate of transistor N432, and turns on transistor N432. Because transistors N432 and N434 are both turned on, bit line BL_Bi is pulled to the low logical value or supply reference voltage VSS at the source of transistor N434 in circuit 410Ai. Further, the low logical value at the gate of transistor N420 in circuit 410Bi is also at the gate of transistor N432 in circuit 410Bi, and turns off transistor N432 in circuit 410Bi. Bit line BLB_Bi therefore remains at the pre-charged high logical value. Effectively, circuits 410Ai and 410Bi also provide low and high logical values to corresponding bit lines BL_Bi and BLB_Bi for use by port P_Bi to write into memory cell 100*i*, when port P_Ai is write disturbed.

In the above illustration, if port P_Aj is write accessed and is write disturbed by port P_Bj, circuits 410Aj and 410Bj function to provide data to bit lines BL_Bj and BLB_Bj to be written to memory cell 100*j* in a manner similar to circuits 410Ai and 410Bi providing data to bit lines BL_Bi and BLB_Bi to be written to memory cell 100*i*, as explained above. Similarly, if port P_Bj is write accessed and is write disturbed by port P_Aj, circuits 410Aj and 410Bj function to provide data to bit lines BL_Aj and BLB_Aj to be written to memory cell 100*j* in a manner similar to circuits 410Ai and 410Bi providing data to bit lines BL_Bi and BLB_Bi to be written to memory cell 100*i* as explained above.

Method

Figure 5:
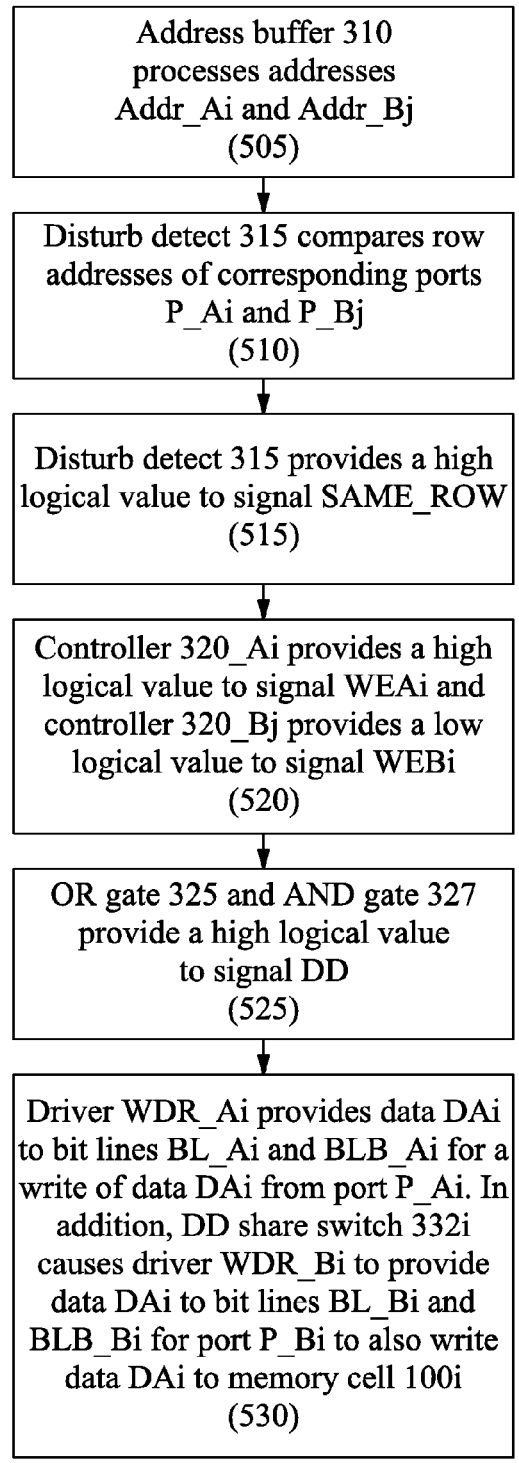
FIG. 5 is a flow chart illustrating a method of operation of the circuits in FIGS. 1-4, in accordance with some embodiments.

FIG. 5 is a flowchart of a method 500 for preventing the write disturb of memory cell 100, in accordance with some embodiments. Method 500 is performed with reference to circuits 100, 200, 300, and 400 in corresponding FIGS. 1, 2, 3, and 4. For illustration, two ports P_Ai and P_Bj are being used for accessing memory array 370 in FIG. 3.

In operation 505, address buffer 310 in FIG. 3 processes address of the two ports, including, for example, stores and latches addresses Addrs_Ai and Addrs_Bj for port P_Ai of memory cell 100*i* and port P_Bj of memory cell 100*j*.

In operation 510, disturb detect 315 determines whether the two ports are of the same row. For example, disturb detect 315 compares the row address of the first port with the row address of the second port. If the two ports are of different rows, no possibility for a write disturb exists, and the two ports access their corresponding memory cells accordingly without a write disturb.

For illustration, however, the two ports correspond to port P_Ai of memory cell 100*i* and port P_Bj of memory cell 100*j*, and are therefore of the same row. As a result, disturb detect 315, in operation 515, provides a high logical value to signal SAME_ROW.

For further illustration, port P_Ai of memory cell 100*i* is write accessed to write data to memory cell 100*i*, and port P_Bj is read accessed from memory cell 100*j*. Because port P_Ai is write accessed, in operation 520, controller control 320_Ai, based on signals CLKAi, WEBAi, and CEBAi, provides a high logical value to signal WEAi. Because port P_Bj is read accessed, controller control 320_Bj, based on signals CLKBj, WEBBj and CEBBj, provides a low logical value to signal WEBj.

In operation 525, OR gate 325 and AND gate 327, based on the logical values of signal SAME_ROW, signal WEAi, and signal WEBj, provide a high logical value to signal DD. For example, because signal SAME_ROW is logically high and signal WEAi is logically high, signal DD is logically high. Further, signal DD is logically high during a time period in which port P_Ai of memory cell 100*i* is write disturbed, such as when word line WL_A and WL_B are activated in a same time period.

In operation 530, driver WDR_Ai, based on column address Y_Ai, and signal WEAi of cell 100*i*, provides data DAi to bit lines BL_Ai and BLB_Ai, for port P_Ai to write data DAi to memory cell 100*i*. Further, DD share switch 332*i*, based on signal DD, causes driver WDR_Bi to provide data DAi to bit lines BL_Bi and BLB_Bi for port P_Bi to also write to data DAi to memory cell 100*i*. Effectively, memory cell 100*i* has a dual write of the same data DAi from both ports P_Ai and P_Bi.

Method 500 is applicable with different read or write operations of port P_Ai, port P_Bi, port P_Aj, and port P_Bi. Such situations include, for example, when a port of a memory cell is disturbed by a dummy read from another port of the same memory cell. The dummy read is replaced with another write to result in a dual write of the same data to the same memory cell. Corresponding circuit elements and signals to cause the dual write are used accordingly based on method 500 and corresponding circuits in FIGS. 1 to 4, as explained above. For example, if port P_Bj is write accessed instead of read accessed, port P_Bj would be disturbed by the dummy read from port P_Aj. As a result, signal WEBj would be generated with a high logical value, and DD data share switch 332j would cause write driver WDR_Aj to provide data DBj to bit lines BL_Aj and BLB_Aj to be written to memory cell 100j to assist port P_Bj in writing data DBj to memory cell 100j.

In some embodiments, a circuit comprises a first memory cell and a data control circuit configured to provide first data and second data. The first memory cell has a first port and a second port. The first data is written from the first port to the first memory cell. The second data is based on information of the first data. The second port is configured to write the second data to the first memory cell based on a detection of a write disturb caused by the second port to the first port.

In some embodiments relate to a method, a first write operation is performed to a first memory cell based on a first port of the first memory cell. The first port corresponds to a first control line and first data. A second write operation is performed to the first memory cell based on a second port of the first memory cell. The second port corresponds to a second control line and second data generated based on information of the first data. Performing the second write operation is based on a time period corresponding on an activation period of the first control line and an activation period of the second control line.

In some embodiments related to a method, a first memory cell is write accessed based on first data and a first port of the first memory cell. A second memory cell is write or read accessed based on a port of the second memory cell. Whether the first port of the first memory cell and the port of the second memory cell are of a same row is determined. Based on a result of the determining, second data for a second port of the first memory cell is generated based on information of the first data, and the second port of the first memory cell is caused to write the second data to the first memory cell.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A circuit comprising:
a first memory cell having a first port and a second port;
a data control circuit configured to provide first data to be written from the first port to the first memory cell and to provide second data based on information of the first data,
wherein,
the second port is configured to write the second data to the first memory cell based on a detection of a write disturb caused by the second port to the first port, wherein the write disturb detection is based on a state of a write enable signal of the first memory cell.

2. The circuit of claim 1, wherein the data control circuit comprises
a data driver associated with the second port; and
a data circuit configured to provide the information of the first data for the data driver to generate the second data.

3. The circuit of claim 1, comprising
a second memory cell; and
a detection circuit configured to detect the write disturb based on a row address of the first port and a row address of a port of the second memory cell.

4. The circuit of claim 1, comprising
a second memory cell; and
a logic circuit configured to generate a detection signal indicating a write disturb condition based on whether the first port and a port of the second memory cell are of a same row, and the write enable signal of the first memory cell.

5. The circuit of claim 4, wherein the logic circuit is configured to generate the detection signal based on a write enable signal of the second memory cell.

6. The circuit of claim 1, wherein
the first port includes a first control line;
the second port includes a second control line; and
the second data corresponds to an activation time period of the first control line and an activation time period of the second control line.

7. The circuit of claim 1, wherein
the first port includes a first control line;
the second port includes a second control line; and
the write disturb is caused by an activation time period of the first control line and an activation time period of the second control line.

8. The circuit of claim 1, wherein
the first port includes a first control line;
the second port includes a second control line;
the circuit comprises a second memory cell having a first port and a second port;
the first port of the second memory cell includes the first control line; and
the second port of the second memory cell includes the second control line.

9. A method comprising:
performing a first write operation to a first memory cell based on a first port of the first memory cell, the first port corresponding to a first control line and first data; and
performing a second write operation to the first memory cell based on a second port of the first memory cell, the second port corresponding to a second control line and second data generated based on information of the first data, wherein the second write operation is performed based on a write disturb detection based on a state of a write enable signal, wherein
performing the second write operation is based on a time period corresponding to an activation period of the first control line and an activation period of the second control line.

10. The method of claim 9, wherein a write disturb occurs to the first write operation based on a read condition of the second port.

11. The method of claim 9, wherein the first control line and the second control line are active during a same time period.

12. The method of claim 9, comprising
accessing the first memory cell based on the first port of the first memory cell; and
accessing a second memory cell based on a port of the second memory cell, the port of the second memory cell including the second control line.

13. The method of claim 9, comprising determining whether the first port of the first memory cell and a port of a second memory cell are of a same row.

14. The method of claim 9, wherein
the first control line is associated with a first port of a second memory cell;
the second control line is associated with a second port of the second memory cell; and
the first memory cell and the second memory cell are on a same row of a memory array.

15. The method of claim 14 wherein
the second port of the second memory cell is write accessed; and
the method comprises causing the first port of the second memory cell to perform a write operation based on information of data to be write accessed to the second memory cell.

16. The method of claim 9, wherein
a data driver associated with the second port generates the second data based on information of the first data.

17. A method comprising:
write accessing a first memory cell based on first data and a first port of the first memory cell;
write or read accessing a second memory cell based on a port of the second memory cell;
determining whether the first port of the first memory cell and the port of the second memory cell are of a same row; and
based on a result of the determining and on a write disturb detection based on a state of a write enable signal,
generating second data for a second port of the first memory cell based on information of the first data; and
causing the second port of the first memory cell to write the second data to the first memory cell.

18. The method of claim 17, wherein
the port of the second memory cell is one of a first port associated with a first control line or a second port associated with a second control line; and
the method comprises causing the first port of the second memory cell to perform a write operation based on information of third data of a write access to the second memory cell.

19. The method of claim 18, wherein
the second data for the second port of the first memory cell corresponds to a time period that the first control line and the second control line are both active.

20. The method of claim 17, wherein
a data driver associated with the second port of the first memory cell generates the second data based on the information of the first data.

* * * * *